(12) United States Patent
    Chou

(10) Patent No.: US 10,157,743 B2
(45) Date of Patent: Dec. 18, 2018

(54) METHODS OF PATTERNING A TARGET LAYER

(71) Applicant: Micron Technology, Inc., Boise, ID (US)

(72) Inventor: Kuo-Yao Chou, Taichung (TW)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/876,386

(22) Filed: Jan. 22, 2018

(65) Prior Publication Data

US 2018/0144937 A1    May 24, 2018

Related U.S. Application Data

(63) Continuation of application No. 15/006,134, filed on Jan. 26, 2016, now Pat. No. 9,911,608.

(51) Int. Cl.
    *H01L 21/033*      (2006.01)
    *H01L 21/311*      (2006.01)
    *H01L 21/3213*     (2006.01)
    *H01L 21/3115*     (2006.01)
    *H01L 21/3215*     (2006.01)

(52) U.S. Cl.
    CPC ...... *H01L 21/0338* (2013.01); *H01L 21/0332* (2013.01); *H01L 21/0335* (2013.01); *H01L 21/0337* (2013.01); *H01L 21/31144* (2013.01); *H01L 21/32139* (2013.01);
    (Continued)

(58) Field of Classification Search
    CPC ............ H01L 21/0332; H01L 21/0335; H01L 21/0337; H01L 21/0338; H01L 21/31144; H01L 21/31155; H01L 21/32139; H01L 21/3215; H01L 21/32155; H01L 21/312;
    (Continued)

(56) References Cited

U.S. PATENT DOCUMENTS 8,853,101 B1   10/2014   Farrell et al.
8,969,965 B2    3/2015   Chang et al.
(Continued)

FOREIGN PATENT DOCUMENTS

CN          102820230 A    12/2012

OTHER PUBLICATIONS

Taiwanese Office Action, dated Dec. 26, 2017, and Search Report, dated Sep. 12, 2017, for Taiwanese Application No. 105107708, 6 pages with English translation.

*Primary Examiner* — Lan Vinh
(74) *Attorney, Agent, or Firm* — TraskBritt

(57) ABSTRACT

A method of forming patterns includes the steps of providing a substrate on which a target layer and a hard mask layer are formed; forming a plurality of first resist patterns on the hard mask layer; performing a tilt-angle ion implant process to form a first doped area and a second doped area in the hard mask layer between adjacent first resist patterns; removing the first resist patterns; coating a directed self-assembly (DSA) material layer onto the hard mask layer; performing a self-assembling process of the DSA material layer to form repeatedly arranged block copolymer patterns in the DSA material layer; removing undesired portions from the DSA material layer to form second patterns on the hard mask layer; transferring the second patterns to the hard mask layer to form third patterns; and etching the target layer through the third patterns.

17 Claims, 6 Drawing Sheets

(52) U.S. Cl.
CPC ..... *H01L 21/31155* (2013.01); *H01L 21/3215* (2013.01); *H01L 21/32155* (2013.01)

(58) Field of Classification Search
CPC ............. H01L 21/31116; H01L 21/032; H01L 21/308; H01L 21/027; C12Y 207/07
USPC ....... 438/163, 706, 710, 712, 714, 719, 723, 438/736, 763, 703
See application file for complete search history.

(56) References Cited

U.S. PATENT DOCUMENTS

| | | | |
|---|---|---|---|
| 9,911,608 B2 * | 3/2018 | Chou | H01L 21/31144 |
| 2006/0081925 A1 * | 4/2006 | Wang | H01L 21/26586 |
| | | | 257/344 |
| 2009/0233448 A1 | 9/2009 | Cho et al. | |
| 2015/0031210 A1 * | 1/2015 | Ban | H01L 21/0338 |
| | | | 438/703 |
| 2015/0294917 A1 | 10/2015 | deVilliers | |
| 2016/0064549 A1 * | 3/2016 | Tsai | H01L 29/7813 |
| | | | 257/288 |
| 2016/0322259 A1 | 11/2016 | Cheng et al. | |
| 2017/0213733 A1 | 7/2017 | Chou | |

* cited by examiner

METHODS OF PATTERNING A TARGET LAYER

CROSS-REFERENCE TO RELATED APPLICATION

This application is a continuation of U.S. patent application Ser. No. 15/006,134, filed Jan. 26, 2016, now U.S. Pat. No. 9,911,608, issued Mar. 6, 2018, the disclosure of which is hereby incorporated herein in its entirety by this reference.

TECHNICAL FIELD

The present invention relates generally to a method of forming patterns, and more particularly to directed self-assembly (DSA) pattern formation in the semiconductor fabricating process.

BACKGROUND

With the prosperous growth of electrical products consumption, the current trend of consumers' demand, including increased portability, computing power, memory capacity and energy efficiency, is for the dimension of such products to almost always be toward small size and delicate design.

The continual reduction in feature sizes results in greater demands on the techniques used to form the features. For example, photolithography is commonly used to pattern these features. Because lithography is typically accomplished by projecting light or radiation onto a surface, the ultimate resolution of a particular lithographic technique depends upon factors such as optics and light or radiation wavelength. However, the present optical lithography technique is inapplicable due to the inherent limitation of the optical characteristics.

A relatively new non-lithography patterning technique, called directed self-assembly (DSA), forms mask patterns through the self-assembly ability of block copolymers. Block copolymers are formed of two or more chemically distinct blocks. Generally, self-assembly is based upon the affinity or preference of one of the blocks for the underlying surface and/or air interface. Therefore, local variations in the surface polarity of the layer to which the DSA material is applied dictate how the block copolymers will align. DSA may be particularly useful for line/space frequency multiplication techniques.

While self-organizing materials may be used to form relatively small mask features, further decreases in the sizes of the mask features are desired due to the constant miniaturization of integrated circuits. Accordingly, there is a continuing need for high resolution methods to pattern small features.

BRIEF SUMMARY

The present disclosure is directed to provide an improved method of forming patterns that is capable of overcoming the limitation of the present optical lithography technique and increasing the pattern resolution of the semiconductor manufacturing process.

In one aspect of the disclosure, a method of forming patterns comprises the steps of providing a substrate on which a target layer and a hard mask layer are formed; forming a plurality of first resist patterns on the hard mask layer; performing a tilt-angle ion implant process to form a first doped area and a second doped area in the hard mask layer between adjacent first resist patterns; removing the first resist patterns; coating a directed self-assembly (DSA) material layer onto the hard mask layer; performing a self-assembling process of the DSA material layer to form repeatedly arranged block copolymer patterns in the DSA material layer; removing undesired portions from the DSA material layer to form second patterns on the hard mask layer; transferring the second patterns to the hard mask layer to form third patterns; and etching the target layer through the third patterns.

According to one embodiment of the disclosure, the first doped area is spaced apart from the second doped area. The first doped area and the second doped area have the same width.

According to one embodiment of the disclosure, the tilt-angle ion implant process changes polarity on the hard mask layer. The polarities of the first doped area and the second doped area are different from the polarity of undoped areas.

According to one embodiment of the disclosure, the DSA material layer comprises block copolymers. The self-assembling process is performed at a temperature lower than a glass transition temperature (Tg) of the block copolymers.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 through FIG. 9 are diagrams illustrating an exemplary method for forming patterns according to one embodiment of the invention, wherein FIG. 1 is a cross-sectional view of a semiconductor structure according to one embodiment of the invention;

FIG. 2 is a cross-sectional view of the semiconductor structure in FIG. 1 after forming a plurality of first resist patterns according to one embodiment of the invention;

FIG. 3 is a cross-sectional view of a doped semiconductor structure after performing tilt-angle ion implant processes according to one embodiment of the invention;

FIG. 4 is a cross-sectional view of the semiconductor structure after removing the first resist patterns according to one embodiment of the invention;

FIG. 5 is a cross-sectional view of the semiconductor structure after coating a directed self-assembly (DSA) material layer according to one embodiment of the invention;

FIG. 6 is a cross-sectional view of the semiconductor structure after performing self-assembling process of the DSA material layer according to one embodiment of the invention;

DETAILED DESCRIPTION

Figure 1:
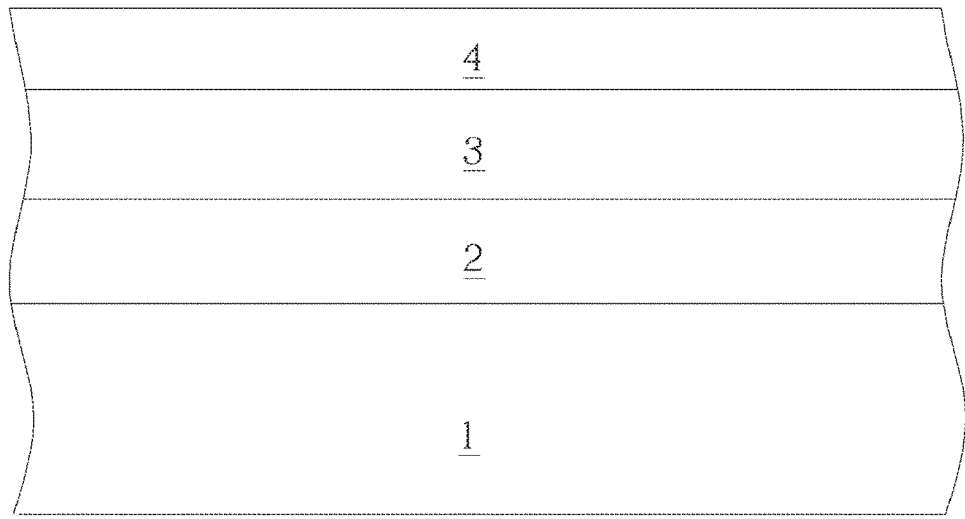

In the following detailed description of the invention, reference is made to the accompanying drawings, which form a part hereof and in which is shown, by way of illustration, specific embodiments in which the invention may be practiced. These embodiments are described in sufficient detail to enable those skilled in the art to practice the invention. Other embodiments may be utilized and structural changes may be made without departing from the scope of the present invention.

The following detailed description is, therefore, not to be taken in a limiting sense, and the scope of the present invention is defined only by the appended claims, along with the full scope of equivalents to which such claims are entitled.

One or more implementations of the present invention will now be described with reference to the accompanying drawings, wherein like reference numerals are used to refer to like elements throughout, and wherein the illustrated structures are not necessarily drawn to scale.

The term "substrate," used herein, includes any structure having an exposed surface onto which a layer is deposited according to the present invention, for example, to form the integrated circuit (IC) structure. The term substrate is understood to include semiconductor wafers. The term substrate is also used to refer to semiconductor structures during processing, and may include other layers that have been fabricated thereupon. The term substrate includes doped and undoped semiconductors, epitaxial semiconductor layers supported by a base semiconductor or insulator, as well as other semiconductor structures well known to one skilled in the art.

The term "horizontal" as used herein is defined as a plane parallel to the conventional major plane or surface of the substrate, regardless of its orientation. The term "vertical" refers to a direction perpendicular to the horizontal as just defined. Terms, such as "on," "above," and "under," are defined with respect to the horizontal plane.

FIG. 1 through FIG. 9 are diagrams illustrating an exemplary method for forming patterns according to one embodiment of the invention.

FIG. 1 is a cross-sectional view of a semiconductor structure according to one embodiment of the invention. First, as shown in FIG. 1, a substrate 1 is provided. A target layer 2, a hard mask layer 3, and a photoresist layer 4 are sequentially formed on a horizontal major surface of the substrate 1. For example, the substrate 1 may comprise a silicon substrate, but is not limited thereto. The target layer 2 may comprise silicon oxide, silicon nitride, silicon, or polysilicon, but is not limited thereto. The hard mask layer 3 may comprise titanium nitride, silicon oxide, silicon nitride, silicon carbide, silicon carbon nitride, or polysilicon, but is not limited thereto.

Figure 2:
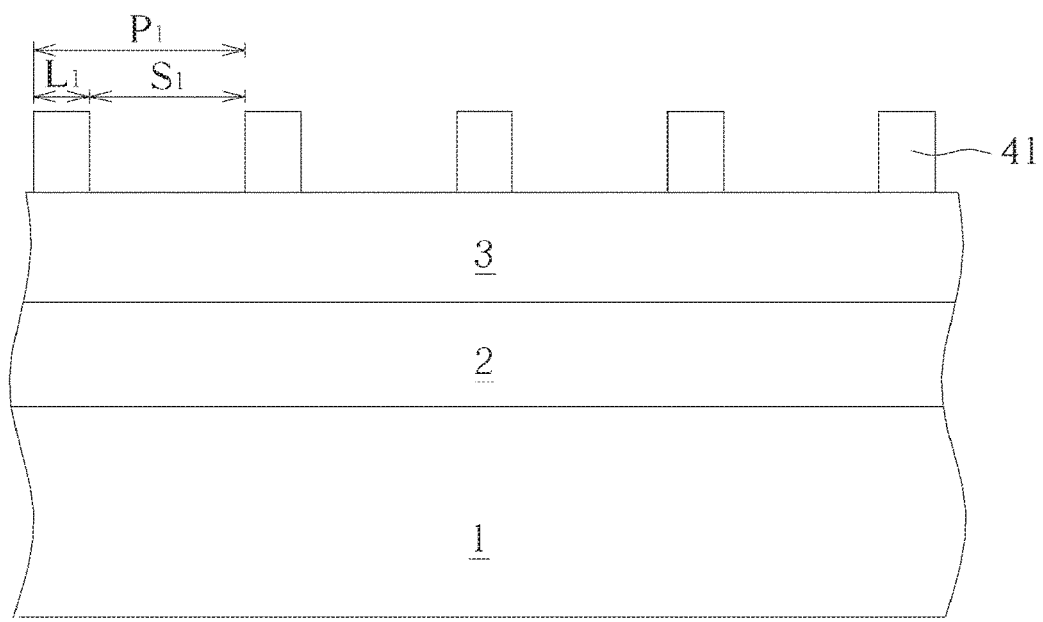

FIG. 2 is a cross-sectional view of the semiconductor structure in FIG. 1 after forming a plurality of first resist patterns according to one embodiment of the invention. As shown in FIG. 2, a lithography process including, but not limited to, exposure and development, is performed to remove parts of the photoresist layer 4, thereby forming a plurality of first resist patterns 41 on the hard mask layer 3. According to the embodiment of the invention, when viewed from the above, the first resist patterns 41 are generally parallel and generally straight stripe (or line-shaped) patterns. The first resist patterns 41 have a pitch $P_1$ including a width $L_1$ of each of the first resist patterns 41 and a space $S_1$ between adjacent first resist patterns 41.

Figure 3:
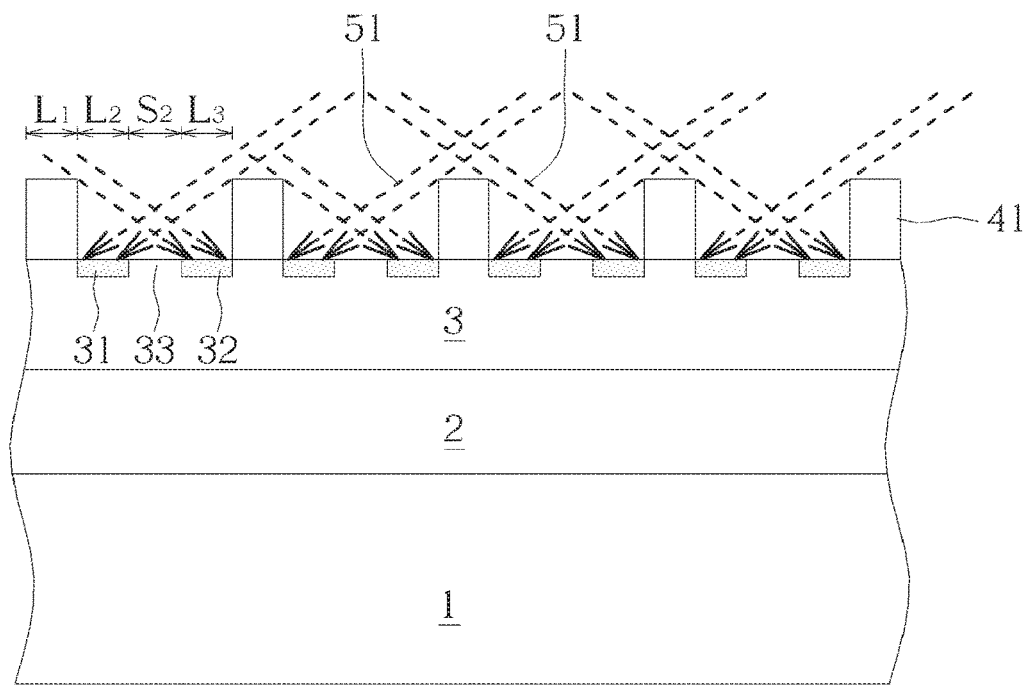

FIG. 3 is a cross-sectional view of a doped semiconductor structure after performing tilt-angle ion implant processes according to one embodiment of the invention. As shown in FIG. 3, tilt-angle ion implant processes 51 are performed to form a first doped area 31 and a second doped area 32 in the hard mask layer 3 between and adjacent to two of the first resist patterns 41. The first doped area 31 is spaced apart from the second doped area 32. By forming the first doped area 31 and the second doped area 32 in the hard mask layer 3, polarity on the hard mask layer 3 is altered corresponding to the pattern of the first doped area 31 and the second doped area 32.

The ion implant processes 51 may comprise multiple ion implant steps which are performed in different directions, for example, two opposite directions, and different implant angles. Moreover, the ion implant processes 51 are not vertical to the horizontal major surface of the substrate 1. Because the ion implant processes 51 are performed at tilt-angles, some ions are hampered by the first resist patterns 41 and are not implanted into the shaded area of the hard mask layer 3 between adjacent first resist patterns 41. It is understood that the height of the first resist patterns 41 and the aforementioned tilt-angles may be adjusted to form the first doped area 31 and the second doped area 32 with desired widths.

The ions used in the tilt-angle ion implant processes 51 may be selected from a group consisting of a phosphate ion, an arsenic ion, an inert gas ion, and a combination thereof. According to the embodiment of the invention, the ions doped into the first doped area 31 and the ions doped into the second doped area 32 may be the same. However, it is understood that in some embodiments the ions doped into the first doped area 31 may be different from the ions doped into the second doped area 32.

According to the embodiment of the invention, the polarities of the first doped area 31 and the second doped area 32 are different from the polarity of undoped areas 33. An undoped area 33 having a width $S_2$ is formed between the first doped area 31 and the second doped area 32. According to the embodiment of the invention, the first doped area 31 and the second doped area 32 have the same width ($L_2=L_3$). However, it is understood that in some embodiments the first doped area 31 and the second doped area 32 may have different widths ($L_2 \neq L_3$) depending upon design requirements.

According to the embodiment of the invention, a width, e.g., $S_1$, between adjacent first resist patterns 41 may be three times larger than the width $L_1$ of the first resist patterns 41 ($S_1:L_1=3:1$). By well controlling the height of the first resist patterns 41 and the tilt-angles during the tilt-angle ion implant processes 51, the width $L_2$ of the first doped area 31 and the width $L_3$ of the second doped area 32 may be equal to the width $S_2$ of the undoped area 33 and the width $L_1$ of the first resist patterns 41 ($L_2=L_3=S_2=L_1$).

Figure 4:
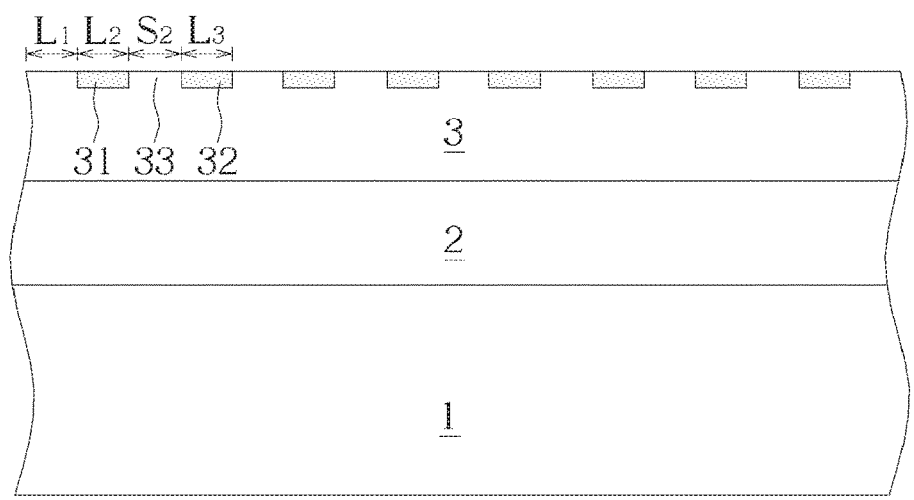

FIG. 4 is a cross-sectional view of the semiconductor structure after removing the first resist patterns 41 according to one embodiment of the invention. Subsequently, as shown in FIG. 4, the first resist patterns 41 are completely removed to expose the regions of the hard mask layer 3, which are previously covered by the first resist patterns 41. According to the embodiment of the invention, the first resist patterns 41 may be removed by using conventional etching methods, but is not limited thereto.

Figure 5:
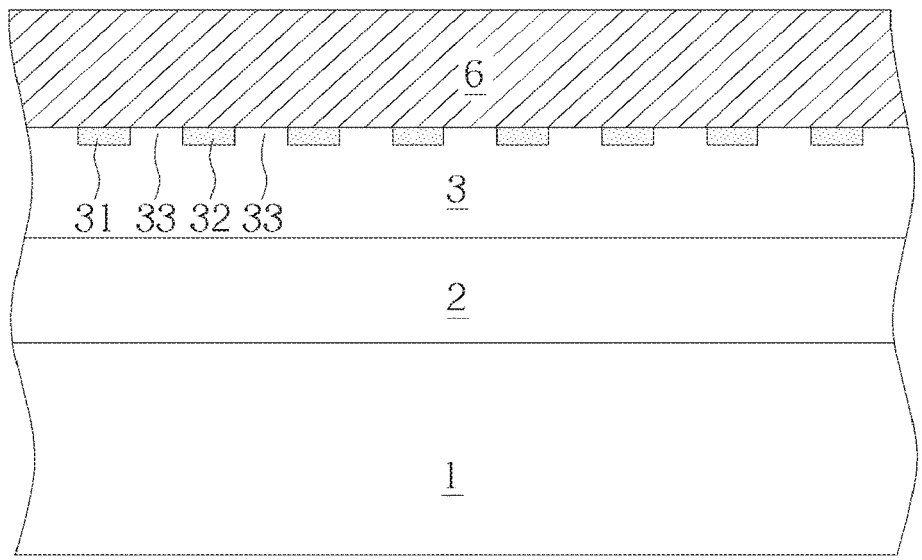

As shown in FIG. 5, subsequently, a directed self-assembly (DSA) material layer 6 is coated onto the hard mask layer 3. The DSA material layer 6 may be coated by spin-on coating, spin casting, brush coating or vapor deposition. According to the embodiment of the invention, the DSA material layer 6 may comprise two or more immiscible compounds or a self-assembling compound comprising at least two components having distinct characteristics, such as functionality, polarity, water affinity, etch resistance, etc., which allows segregation and alignment of the two compounds or components in a reasonable manner, as well as selective removal of one compound or component.

According to the embodiment of the invention, the DSA material layer 6 may comprise block copolymers of at least two different polymers. Block copolymers are particularly well-suited for DSA techniques because they can be synthesized to include at least two distinct blocks allowing for each component to align under appropriate conditions, and be selectively removed after alignment. According to the embodiment of the invention, for example, the block copolymers may comprise polystyrene (PS) and poly(methyl methacrylate) (PMMA), but is not limited thereto. It will be appreciated that the size of each block copolymer and the ratio of the constituent block copolymers may be chosen to facilitate a self-assembling process and to form organized block domains having desired dimensions. A block copolymer having longer copolymers may be used to form larger domains and a block copolymer having shorter copolymers may be used to form smaller domains.

Figure 6:
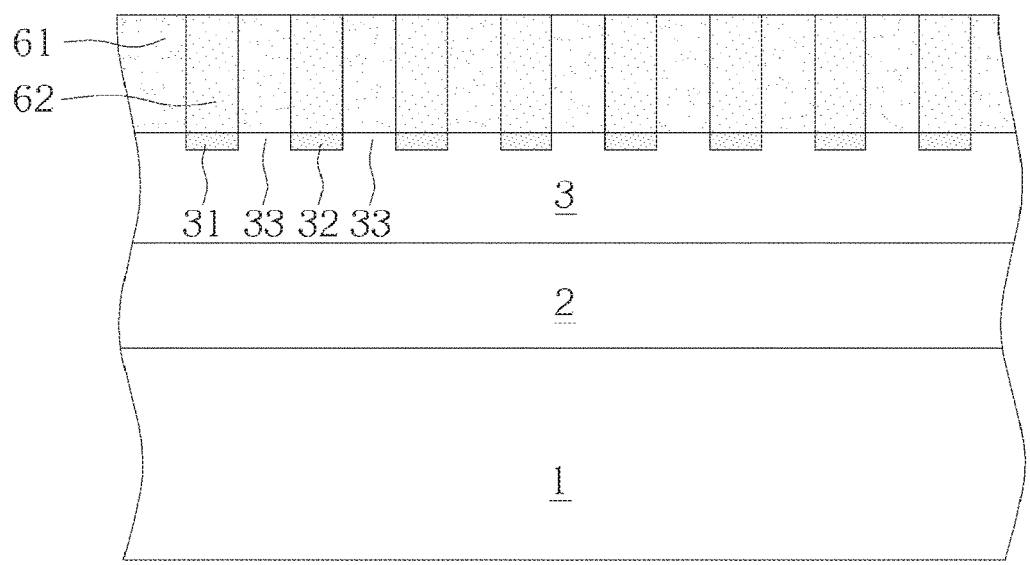

Subsequently, as shown in FIG. 6, a self-assembling process of the DSA material layer 6 is performed to form first and second block copolymer patterns 61 and 62 repeated and alternately arranged corresponding to the first doped area 31, the second doped area 32 and the undoped area 33 on the hard mask layer 3. The first doped area 31 and the second doped area 32 in the hard mask layer 3 can provide the interface for DSA material layer 6 to do a self-assembling process. The self-assembling process may comprise an annealing process, but is not limited thereto. The first block copolymer patterns 61 of the DSA material layer 6 are formed directly above the undoped areas 33 of the hard mask layer 3. The second block copolymer patterns 62 of the DSA material layer 6 are formed directly above the first doped areas 31 and the second doped areas 32. The first block copolymer patterns 61 and the second block copolymer patterns 62 are repeatedly arranged.

It will be appreciated that the widths of the first and second block copolymer patterns 61 and 62 are basically determined by the sizes (or lengths) of the two different polymers of the block copolymers. The self-assembling process may be facilitated and accelerated by heating to sufficient temperatures. The temperature may be chosen to be sufficiently low to prevent adversely affecting the block copolymers or the semiconductor devices fabricated in the substrate 1. According to the embodiment of the invention, the self-assembling process is performed at a temperature lower than a glass transition temperature (Tg) of the block copolymers. The repeated and alternately arranged block copolymer patterns 61 and 62 may serve as a mask for patterning the underlying layers.

Figure 7A:
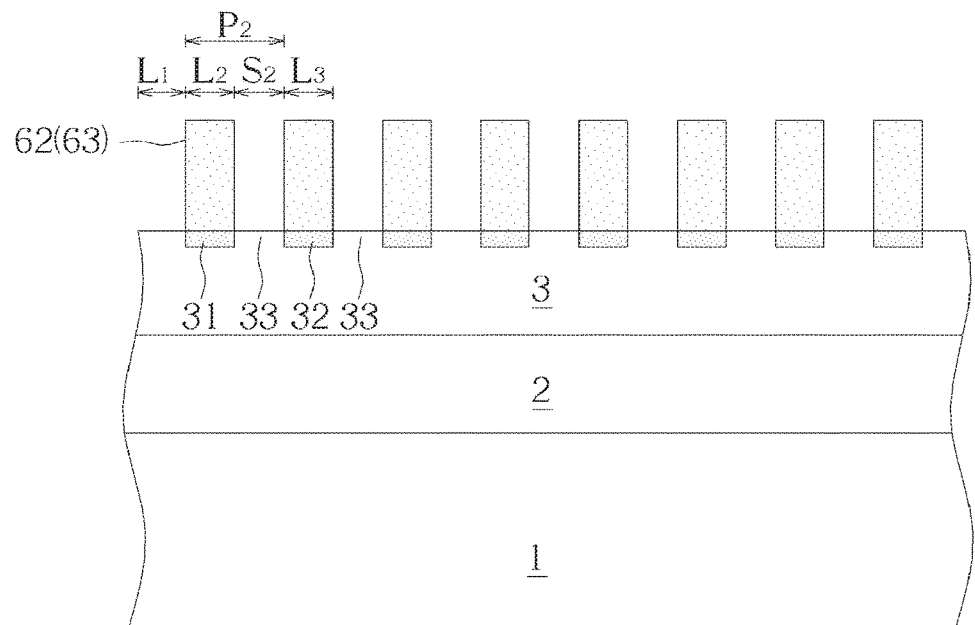
FIG. 7A and FIG. 7B are cross-sectional views of the semiconductor structure after removing undesired portions from the DSA material layer to form second patterns according to embodiments of the invention.
Figure 7B:
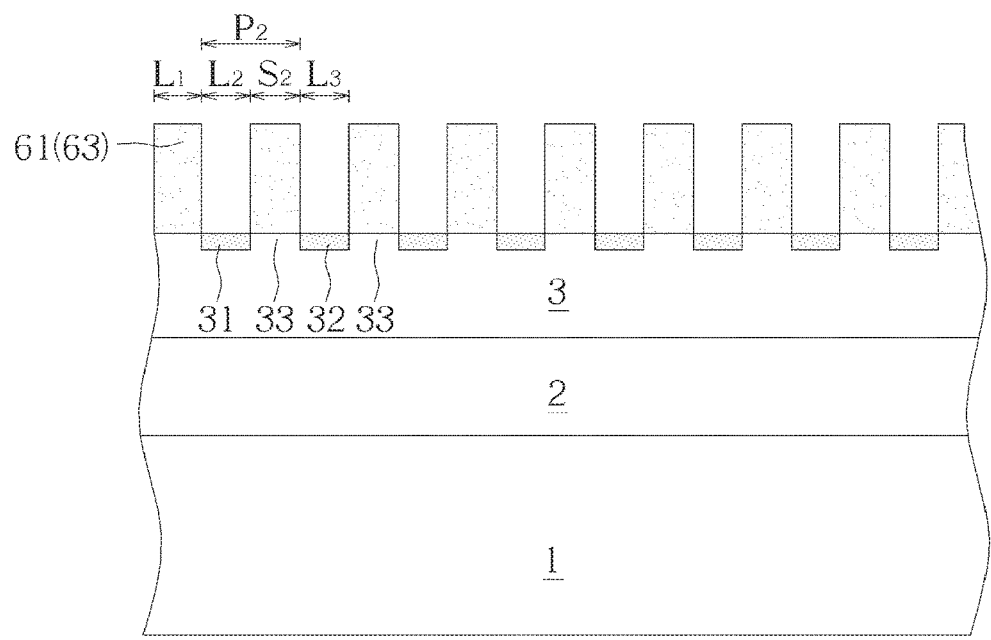

FIG. 7A and FIG. 7B are cross-sectional views of the semiconductor structure after removing undesired portions from the DSA material layer 6 to form second patterns according to embodiments of the invention. As shown in FIG. 7A, the undesired portions, for example, the first block copolymer patterns 61 directly positioned on the undoped areas 33, are removed from the DSA material layer 6, while leaving the second block copolymer patterns 62 intact. Alternatively, as shown in FIG. 7B, the undesired portions, for example, the second block copolymer patterns 62 directly positioned on the first doped areas 31 and the second doped areas 32, are removed from DSA material layer 6, while leaving the first block copolymer patterns 61 intact.

Because the first block copolymer patterns 61 and the second block copolymer patterns 62 have distinct characteristics, either the first block copolymer patterns 61 or the second block copolymer patterns 62 can be selectively removed to form the second patterns 63. For example, the first block copolymer patterns 61 may have a first etch rate in a wet or dry etchant, while the second block copolymer patterns 62 may have a second etch rate in the same wet or dry etchant, wherein the first and second etch rates are different from each other. In particular, the first etch rate may be higher than the second etch rate depending upon the etchant used. Thus, a suitable etchant can be chosen to selectively remove one of the first or second block copolymer patterns 61 and 62 thereby leaving the other of the first or second block copolymer patterns 61 and 62 substantially intact on the hard mask layer 3 to form the second patterns 63. The second patterns 63 have a pitch P2 including widths L2 and L3 of the first and second doped area 31 and 32 and width 8 2 of the undoped area 33 of the hard mask layer 3. It is noteworthy that the pitch P2 is smaller than the pitch P1 of the first resist patterns 41.

Figure 8A:
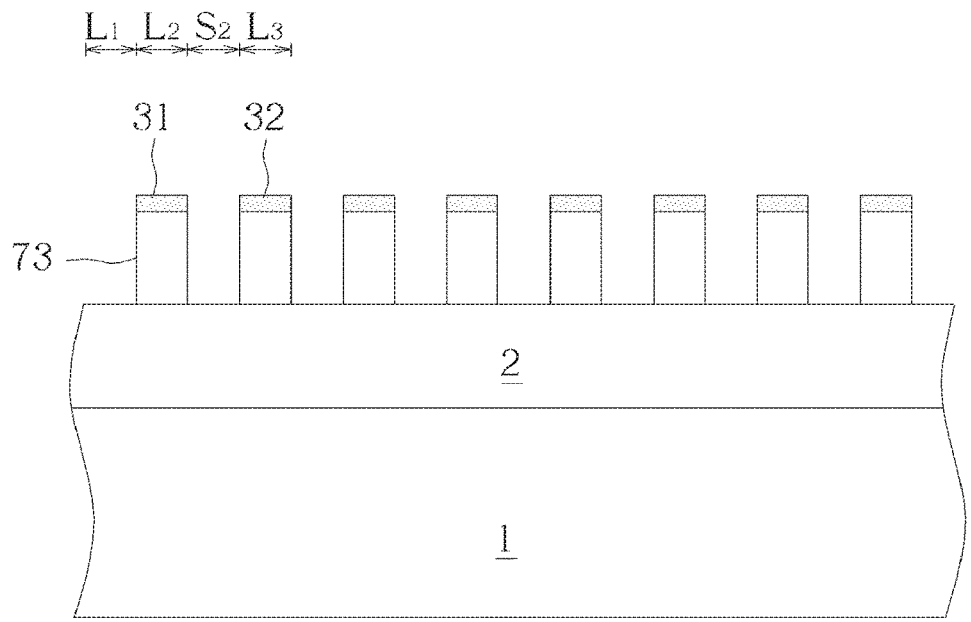
FIG. 8A and FIG. 8B are cross-sectional views of the semiconductor structures of FIG. 7A and FIG. 7B, respectively, after transferring the second patterns to the hard mask layer to form third patterns according to one embodiment of the invention.
Figure 8B:
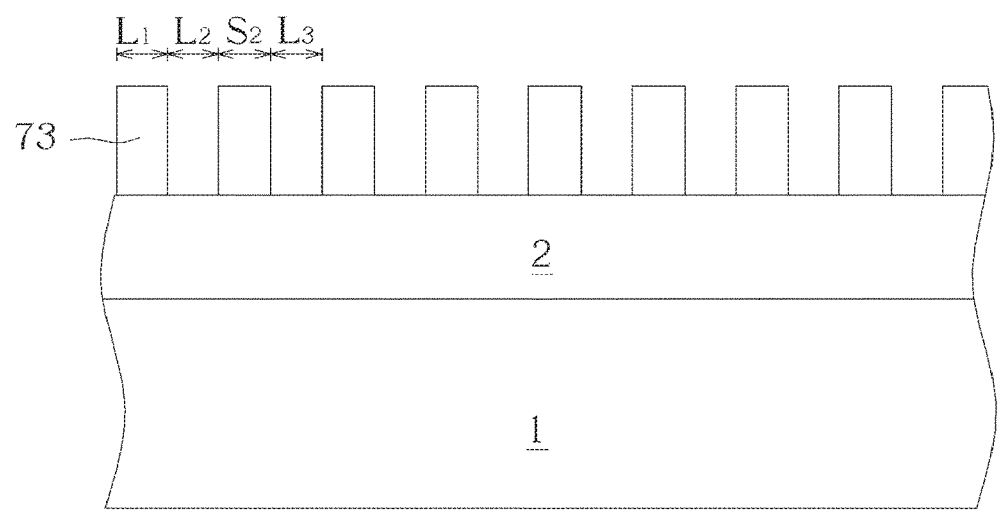

FIG. 8A and FIG. 8B are cross-sectional views of the semiconductor structures of FIG. 7A and FIG. 7B, respectively, after transferring the second patterns 63 to the hard mask layer 3 to form third patterns according to one embodiment of the invention. As shown in FIG. 8A and FIG. 8B, the second patterns 63 are used as an etch mask and an etching process such as a dry etching process is performed to transfer the second patterns 63 to the hard mask layer 3 thereby forming third patterns 73.

Figure 9A:
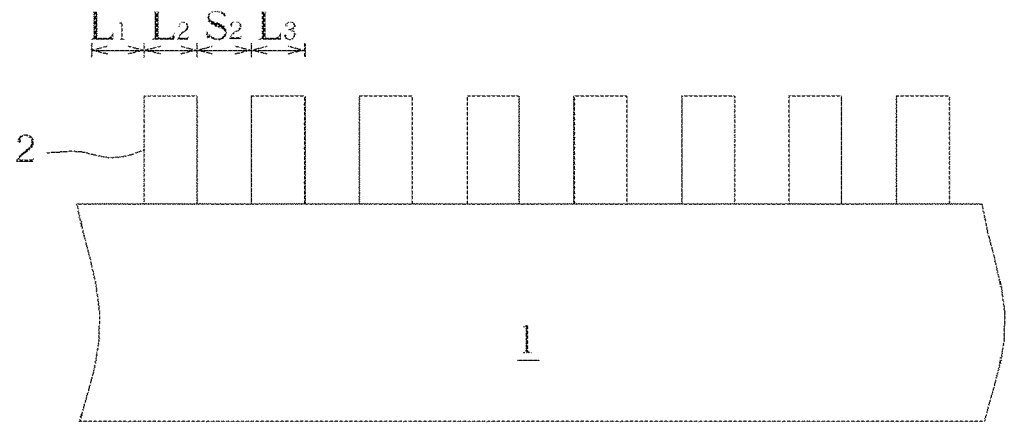
FIG. 9A and FIG. 9B are cross-sectional views of the semiconductor structures of FIG. 8A and FIG. 8B, respectively, after etching the target layer through the third patterns according to one embodiment of the invention.
Figure 9B:
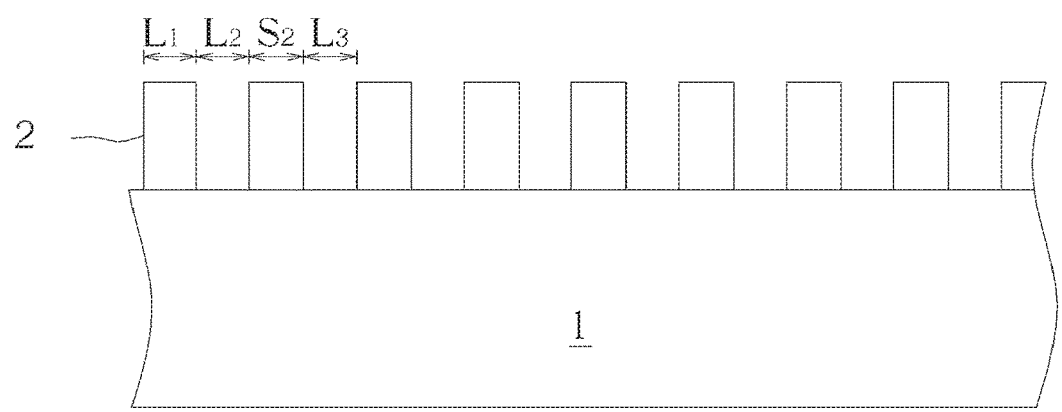

FIG. 9A and FIG. 9B are cross-sectional views of the semiconductor structures of FIG. 8A and FIG. 8B, respectively, after etching the target layer through the third patterns according to one embodiment of the invention. Finally, as shown in FIG. 9A and FIG. 9B, using the third patterns 73 as an etch mask, another etching process such as a dry etching process is performed to transfer the third patterns 73 to the target layer 2.

Through performing the preceding processes, patterns formed in the target layer 2 as depicted in FIG. 9A and FIG. 9B have a finer pitch than that of originally formed first photoresist patterns 41 on the hard mask layer 3.

To sum up, the present disclosure provides an improved method of directed self-assembly (DSA) pattern formation in the semiconductor fabricating process that is capable of overcoming the limitation of the present optical lithography technique and increasing the pattern resolution of the semiconductor manufacturing process.

A method of forming patterns comprises the steps of providing a substrate 1 on which a target layer 2 and a hard mask layer 3 are formed; forming a plurality of first resist patterns 41 on the hard mask layer 3; performing a tilt-angle ion implant process 51 to form a first doped area 31 and a second doped area 32 in the hard mask layer 3 between adjacent first resist patterns 41; removing the first resist patterns 41; coating a directed self-assembly (DSA) material layer 6 onto the hard mask layer 3; performing a self-assembling process of the DSA material layer 6 to form repeatedly arranged block copolymer patterns 61 and 62 in the DSA material layer 6; removing undesired portions from the DSA material layer 6 to form second patterns 63 on the hard mask layer 3; transferring the second patterns 63 to the hard mask layer 3 to form third patterns 73; and etching the target layer 2 through the third patterns 73.

The first doped area 31 is spaced apart from the second doped area 32. The first doped area 31 and the second doped area 32 have the same width (L2=L3).

The tilt-angle ion implant process 51 changes polarity on the hard mask layer 3. The polarities of the first doped area 31 and the second doped area 32 are different from the polarity of undoped areas 33.

The DSA material layer 6 comprises block copolymers. The self-assembling process is performed at a temperature lower than a glass transition temperature (Tg) of the block copolymers.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of patterning a target layer, comprising:
performing a tilt-angle ion implant process to form first doped areas and second doped areas in a hard mask material and between adjacent resist patterns on the hard mask material, a width of the first doped areas and a width of the second doped areas formed by adjusting a height of the resist patterns and an angle of the tilt-angle ion implant process;
removing the resist patterns;
forming a directed self-assembly (DSA) material comprising a first block copolymer and a second block copolymer on the hard mask material;
self-assembling the DSA material to form first block copolymer patterns and second block copolymer patterns in the DSA material;
removing the first block copolymer patterns or the second block copolymer patterns to form a DSA material pattern;
transferring the DSA material pattern to the hard mask material to form a hard mask pattern; and
removing a portion of a target layer exposed through the hard mask pattern.

2. The method of claim 1, wherein performing a tilt-angle ion implant process to form first doped areas and second doped areas in a hard mask material comprises forming a first doped area and a second doped area between two adjacent resist patterns.

3. The method of claim 1, wherein performing a tilt-angle ion implant process to form first doped areas and second doped areas in a hard mask material comprises performing multiple ion implant acts in different directions and at different angles.

4. The method of claim 1, wherein performing a tilt-angle ion implant process to form first doped areas and second doped areas in a hard mask material comprises performing the tilt-angle ion process in a non-vertical direction to a horizontal major surface of the hard mask material.

5. The method of claim 1, wherein performing a tilt-angle ion implant process to form first doped areas and second doped areas in a hard mask material comprises forming each of the first doped areas and the second doped areas from opposite directions and at different implant angles.

6. The method of claim 1, wherein performing a tilt-angle ion implant process to form first doped areas and second doped areas in a hard mask material comprises implanting different ions into the first doped areas and the second doped areas.

7. The method of claim 1, wherein performing a tilt-angle ion implant process to form first doped areas and second doped areas in a hard mask material comprises implanting the same ions into the first doped areas and into the second doped areas.

8. The method of claim 1, wherein performing a tilt-angle ion implant process to form first doped areas and second doped areas in a hard mask material comprises altering a polarity of a portion of the hard mask material.

9. The method of claim 8, wherein altering a polarity of a portion of the hard mask material comprises altering the polarity of the hard mask material in the first doped areas and the second doped areas relative to a polarity of undoped hard mask material.

10. A method of patterning a target layer, comprising:
forming first doped areas and second doped areas in a hard mask material by a tilt-angle ion implant process, each of a first doped area of the first doped areas and a second doped area of the second doped areas between adjacent resist patterns on the hard mask material and separated by undoped areas and a width of the first doped areas and a width of the second doped areas formed by adjusting a height of the resist patterns and an angle of the tilt-angle ion process;
removing the resist patterns;
forming a directed self-assembly (DSA) material comprising a first block copolymer and a second block copolymer on the hard mask material;
self-assembling the DSA material to form first block copolymer patterns and second block copolymer patterns on the hard mask material;
removing the first block copolymer patterns or the second block copolymer patterns to form a DSA material pattern;
transferring the DSA material pattern to the hard mask material to form a hard mask pattern; and
removing a portion of a target layer exposed through the hard mask pattern.

11. The method of claim 10, wherein forming first doped areas and second doped areas in a hard mask material by a tilt-angle ion implant process comprises forming the first doped areas and the second doped areas comprising substantially the same width.

12. The method of claim 10, wherein forming first doped areas and second doped areas in a hard mask material by a tilt-angle ion implant process comprises forming a width of the first doped areas and a width of the second doped areas to be substantially equal to a width of the resist patterns.

13. The method of claim 10, wherein forming first doped areas and second doped areas in a hard mask material by a tilt-angle ion implant process comprises forming a width between adjacent resist patterns to be three times larger than a width of the resist patterns.

14. The method of claim 10, wherein self-assembling the DSA material to form first block copolymer patterns and second block copolymer patterns comprises forming the first block copolymer patterns over the undoped areas and forming the second block copolymer patterns over the first doped areas and the second doped areas.

15. The method of claim 10, wherein removing the first block copolymer patterns or the second block copolymer patterns to form a DSA material pattern comprises forming the DSA material pattern comprising a pitch smaller than a pitch of the resist patterns.

16. The method of claim 10, wherein removing the first block copolymer patterns or the second block copolymer patterns to form a DSA material pattern comprises forming the DSA material pattern at a pitch comprising the width of the first doped areas and a width of the undoped areas.

17. The method of claim 10, wherein removing a portion of a target layer exposed through the hard mask pattern comprises forming a pattern in the target layer comprising a pitch smaller than a pitch of the resist patterns.

\* \* \* \* \*

UNITED STATES PATENT AND TRADEMARK OFFICE
CERTIFICATE OF CORRECTION

PATENT NO. : 10,157,743 B2
APPLICATION NO. : 15/876386
DATED : December 18, 2018
INVENTOR(S) : Kuo-Yao Chou It is certified that error appears in the above-identified patent and that said Letters Patent is hereby corrected as shown below:

On the Title Page

In ITEM (72) Inventor:  change "Kuo-Yao Chou, Taichung (TW)" to --Kuo-Yao Chou, Taichung City (TW)--

In the Specification

Column 6, Line 17, change "width 8 2 of the" to --width $S_2$ of the--

In the Claims

Claim 4, Column 7, Line 49, change "tilt-angle ion process" to --tilt-angle ion implant process--

Claim 10, Column 8, Line 18, change "tilt-angle ion process;" to --tilt-angle ion implant process;--

Signed and Sealed this
Twenty-ninth Day of January, 2019

Andrei Iancu
*Director of the United States Patent and Trademark Office*